United States Patent
Hou

(10) Patent No.: US 11,404,485 B2
(45) Date of Patent: Aug. 2, 2022

(54) ARRAY SUBSTRATE, METHOD OF FABRICATING ARRAY SUBSTRATE, AND DISPLAY PANEL

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 499 days.

(21) Appl. No.: 16/493,123

(22) PCT Filed: Apr. 19, 2019

(86) PCT No.: PCT/CN2019/083421
§ 371 (c)(1),
(2) Date: Sep. 11, 2019

(87) PCT Pub. No.: WO2020/048139
PCT Pub. Date: Mar. 12, 2020

(65) Prior Publication Data
US 2021/0384265 A1 Dec. 9, 2021

(30) Foreign Application Priority Data
Sep. 7, 2018 (CN) .......................... 201811045942.6

(51) Int. Cl.
*H01L 27/32* (2006.01)
*H05B 45/60* (2022.01)
(Continued)

(52) U.S. Cl.
CPC ...... *H01L 27/3206* (2013.01); *H01L 51/5265* (2013.01); *H01L 51/56* (2013.01);
(Continued)

(58) Field of Classification Search
CPC . H01L 27/3206; H01L 51/5265; H01L 51/56; H01L 27/3246; H01L 27/3283;
(Continued)

(56) References Cited

U.S. PATENT DOCUMENTS

2007/0120474 A1* 5/2007 Kubota ............... H01L 51/5048
428/917
2008/0238297 A1* 10/2008 Oota ........................ H01L 51/56
313/500
(Continued)

FOREIGN PATENT DOCUMENTS

| CN | 104966723 A | 10/2015 |
|---|---|---|
| CN | 105097830 A | 11/2015 |

(Continued)

OTHER PUBLICATIONS

Office Action dated Mar. 17, 2020, issued in counterpart CN Application No. 201811045942.6, with English translation (19 pages).
(Continued)

*Primary Examiner* — Kevin Quarterman
(74) *Attorney, Agent, or Firm* — WHDA, LLP

(57) ABSTRACT

The present disclosure generally relates to display technologies. An array substrate may include a plurality of first pixel units and a plurality of second pixel units arranged in alternating manner. Each of the plurality of first pixel units may include a first plurality of subpixels, each of the first plurality of subpixels comprising a functional stack that has a thickness of from 180 to 360 nm. Each of the plurality of second pixel units may include a second plurality of subpixels, each of the second plurality of subpixels comprising a functional stack that has a thickness of from 80 to 140 nm.

18 Claims, 10 Drawing Sheets

(51) Int. Cl.
*H01L 51/52* (2006.01)
*H01L 51/56* (2006.01)
*H01L 51/50* (2006.01)

(52) U.S. Cl.
CPC .......... *H05B 45/60* (2020.01); *H01L 27/3246* (2013.01); *H01L 27/3283* (2013.01); *H01L 51/5088* (2013.01); *H01L 2251/558* (2013.01)

(58) Field of Classification Search
CPC ........... H01L 51/5088; H01L 2251/558; H01L 27/3211; H01L 2227/323; H05B 45/60
See application file for complete search history.

(56) References Cited

U.S. PATENT DOCUMENTS

| | | | | |
|---|---|---|---|---|
| 2009/0108741 | A1* | 4/2009 | Yokoyama | .......... H01L 27/3211 445/24 |
| 2010/0090203 | A1* | 4/2010 | Obata | ................ H01L 27/3246 257/40 |
| 2017/0125496 | A1 | 5/2017 | Oh et al. | |
| 2017/0141341 | A1 | 5/2017 | Liao et al. | |
| 2017/0187001 | A1 | 6/2017 | Fang et al. | |
| 2017/0243928 | A1 | 8/2017 | Yang | |
| 2017/0270868 | A1 | 9/2017 | Li et al. | |
| 2018/0101039 | A1 | 4/2018 | Lin et al. | |
| 2018/0205040 | A1 | 7/2018 | Kim et al. | |
| 2018/0212198 | A1* | 7/2018 | Inoue | .................. H01L 27/3248 |
| 2018/0254303 | A1 | 9/2018 | Mishima | |
| 2019/0280055 | A1* | 9/2019 | Hack | ................... H01L 51/5265 |

FOREIGN PATENT DOCUMENTS

| | | |
|---|---|---|
| CN | 105720081 A | 6/2016 |
| CN | 106531767 A | 3/2017 |
| CN | 106816453 A | 6/2017 |
| CN | 107359283 A | 11/2017 |
| CN | 107871753 A | 4/2018 |
| CN | 109037301 A | 12/2018 |

OTHER PUBLICATIONS

Translation of International Search Report dated Jul. 4, 2019, issued in counterpart Application No. PCT/CN2019/083421. (12 pages).

* cited by examiner

ARRAY SUBSTRATE, METHOD OF FABRICATING ARRAY SUBSTRATE, AND DISPLAY PANEL

CROSS-REFERENCE TO RELATED APPLICATIONS

This application claims benefit of the filing date of Chinese Patent Application No. 201811045942.6 filed on Sep. 7, 2018, the disclosure of which is hereby incorporated in its entirety by reference.

TECHNICAL FIELD

The present disclosure generally relates to display technologies, including an array substrate, a method of fabricating an array substrate, and a display device comprising an array substrate.

BACKGROUND

Currently, the display technologies mainly include two main categories: organic light emitting diode (OLED) technology and liquid crystal display (LCD) technology. OLEDs have numerous advantages that contribute to their popularity in the field of display technology. For example, OLEDs are self-illuminating, wide viewing angle, good contrast, quick response times, high brightness, and high luminance. Display panels incorporating OLEDs also tend to be thinner, lighter, and more flexible than LCD panels. These advantages combine to make OLEDs a focus in the developments of display technologies.

BRIEF SUMMARY

An embodiment of the present disclosure is an array substrate. The array substrate may comprise a plurality of first pixel units and a plurality of second pixel units arranged in alternating manner. Each of the plurality of first pixel units may comprise a first plurality of subpixels, and each of the first plurality of subpixels may comprise a functional stack that has a thickness of from 180 to 360 nm. Each of the plurality of second pixel units may comprise a second plurality of subpixels, and each of the second plurality of subpixels may comprise a functional stack that has a thickness of from 80 to 140 nm.

In at least some embodiments, the array substrate may further comprise a control circuit coupled to the plurality of first pixel units and the plurality of second pixel units. The control circuit may be configured to switch the plurality of first pixel units and the plurality of second pixel units between a first mode and a second mode. In the first mode, the plurality of first pixel units may be configured to have a luminance higher than the plurality of second pixel units. In the second mode, the plurality of the first pixel units may be configured to have a luminance lower than the plurality of second pixel, units.

In at least some embodiments, in the first mode, a ratio of an average luminance of the plurality of first pixel units to an average luminance of the plurality of second pixel units may be from 3:2 to 4:1. In the second mode, a ratio of an average luminance of the plurality of first pixel units to an average luminance of the plurality of second pixel units may be from 1:4 to 2:3.

In at least some embodiments, each functional stack may comprise a first electrode, a hole injection layer, a hole transport layer, an emission layer, an electron transport layer, and an electron injection layer arranged in this order.

In at least some embodiments, a thickness of each functional stack may be adjusted by adjusting a thickness of a hole injection layer in each functional stack.

In at least some embodiments, at least one of the first plurality of subpixels and at least one of the second plurality of subpixels may comprise a thickening layer. The thickness of the hole injection layer may be adjusted by adjusting a thickness of the thickening layer.

In at least some embodiments, the first plurality of subpixels may comprise a first subpixel comprising a first functional stack, a second subpixel comprising a second functional stack, and a third subpixel comprising a third functional stack. The first functional stack may have a thickness T1 of 300 nm to 360 nm. The second functional stack may have a thickness T2 of 230 nm to 300 nm. The third functional stack may have a thickness T3 of 180 nm to 240 nm.

In at least some embodiments, the second plurality of subpixels may comprise a fourth subpixel having a fourth functional stack, a fifth subpixel having a fifth functional stack, and a sixth subpixel having a sixth functional stack. The fourth functional stack may have a thickness T4 of 100 nm to 140 nm. The fifth functional stack may have a thickness T5 of 90 not to 130 nm. The sixth functional stack may have a thickness T6 of 80 nm to 120 nm.

In at least some embodiments, the thicknesses T1, T2, T3, T4, T5, T6 may satisfy the relationship: T1>T2>T3>T4>T5>T6.

In at least some embodiments, hole injection layers in the first, second, third, fourth, fifth, and sixth functional stacks may have thicknesses TH1, TH2, TH3, TH4, TH5, TH6, respectively that satisfy the relationship: TH1>TH2>TH3>TH4>TH5>TH6.

Another embodiment of the present disclosure is a display panel. The display panel may comprise an array substrate as described above.

Another embodiment of the present disclosure is a method of fabricating an array substrate. The method may comprise forming a plurality of first pixel units and a plurality of second pixel units on a base substrate. The forming of the plurality of first pixel units and the plurality of second pixel units may comprise: forming a plurality of thickening layers on a flattening layer provided on a base substrate; forming a first electrode layer on each of the plurality of thickening layers; forming a pixel defining layer comprising openings at positions corresponding to the plurality of thickening layers; and forming a hole injection layer on each of the first electrode layer. The plurality of thickening layers may be formed with different thicknesses.

In at least some embodiments, the first electrode layers may be formed with a uniform thickness. The pixel defining layer may be formed with a uniform thickness.

In at least some embodiments, the hole injection layers may be formed with different thicknesses based on the different thicknesses of the plurality of thickening layers.

In at least some embodiments, the forming of the hole injection layer may comprise coating a hole injection layer forming material on an entire surface of the first electrode layer and the pixel defining layer.

In at least some embodiments, the pixel defining layer may comprise a hydrophobic material.

In at least some embodiments, the method may further comprise forming a control circuit coupled to the plurality of first pixel units and the plurality of second pixel units.

Another embodiment of the present disclosure is a method of driving a control circuit. The method may comprise providing a control circuit coupled to the plurality of first pixel units and the plurality of second pixel units; supplying, via the control circuit, signals to the plurality of first pixel units and the plurality of second pixel units to switch simultaneously between a first mode and a second mode. In the first mode, the plurality of first pixel units may be configured to have a higher luminance than the plurality of second pixel units. In the second mode, the plurality of the first pixel units may be configured to have a lower luminance than the plurality of second pixel units.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent front the following detailed description taken in conjunction with the accompanying drawings in which:

FIG. 1 shows an arrangement of pixel units in an array substrate according to an embodiment of the present disclosure;

Figure 2:
FIG. 2 shows a schematic diagram of a subpixel in an array substrate according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Currently, the display technologies mainly include two main categories: organic light emitting diode (OLED) technology and liquid crystal display (LCD) technology. OLEDs have numerous advantages that contribute to their popularity in the field of display technology. For example, OLEDs are self-illuminating, wide viewing angle, good contrast, quick response times, high brightness, and high luminance. Display panels incorporating OLEDs also tend to be thinner, lighter, and more flexible than LCD panels. These advantages combine to make OLEDs a focus in the developments of display technologies.

One development in OLED technology is the use of microcavities to increase light extraction in an OLED display panel. Microcavities have also been used to enhance the display effects of an OLED display panel, including enhancing color saturation and color gamut of the OLED display panel.

However, conventional microcavity structures tend to result in a large angular dependence of the color and luminance of the emitting light, which can seriously impede the effectiveness of the OLEDs for display applications.

The present disclosure addresses the problems associated with conventional OLED technologies, including the lack of balance between viewing angles and color gamut. The present disclosure thus aims to provide an array substrate, a method of fabricating an array substrate, and a display device, which can enhance the color gamut of a display panel without sacrificing the wide viewing angles of the display panel. An array substrate according to the present disclosure generally includes a plurality of first pixel units and a plurality of second pixel units. Each first pixel unit comprises a plurality of subpixels. Each subpixel of the first pixel unit comprises a microcavity. Each second pixel unit comprises a plurality of subpixels.

When a viewer is viewing the display panel from the front, or substantially from the front, of the display panel, a control circuit is configured to switch the first and second pixel units to a first mode in which the plurality of first pixel units are the primary light emitters. A viewer is considered to be viewing from the front, or substantially from the front, of the display panel, if a line from the viewer to a center of the surface of the display panel facing the viewer makes an angle of 30° or more with respect to that surface.

The microcavities in the first pixel units can fine-time the emission spectra of the first pixel units. Fine-tuned spectra can enhance the color gamut, and improve the color purity and vivacity of the display panel. A microcavity resonates at a specific wavelength, so that only light corresponding to that wavelength is emitted. The presence of microcavities in a pixel unit can therefore narrow the emission spectrum of the pixel unit by significantly enhancing intensity at wavelengths that correspond to the microcavities' resonant frequencies, while reducing intensity at wavelengths outside of those resonance frequencies.

When the viewer is viewing the display panel at an angle, the control circuit is configured to switch the first and second pixel units to a second mode in which the plurality of second pixel units are the primary light emitters. A viewer is considered to be viewing the display panel at an angle, if a line from the viewer to a center of the surface of the display panel facing the viewer makes an angle of 30° or less with respect to that surface.

Since none of the second pixel units comprises a microcavity, the second pixel units therefore have a wider viewing angle, and as a result, the viewing angle of the display panel can be enhanced. An array substrate according to the present disclosure is configured to switch between the first and second modes depending on the viewer's viewing angle, which makes it possible to strike a remarkable balance between viewing angle and color gamut, and to optimize the display effects for the viewer. In addition, an array substrate according to the present disclosure has a simple construction, which can lower the manufacturing costs.

Figure 1:
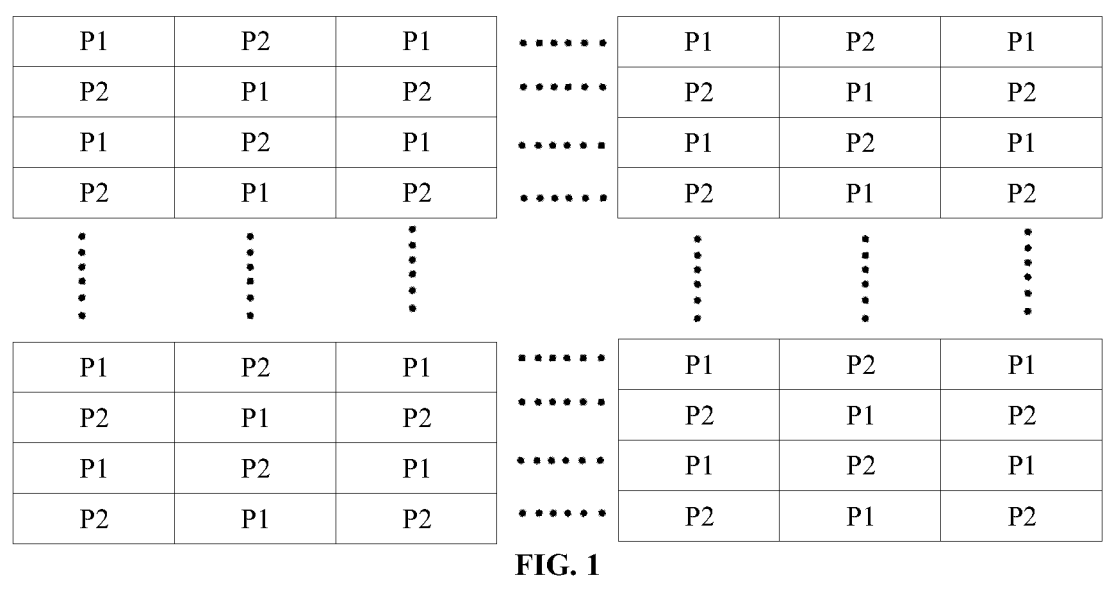

The present disclosure provides an array substrate. FIG. 1 shows an arrangement of pixel units in an array substrate according to an embodiment of the present disclosure. As shown in FIG. 1, the array substrate comprises a plurality of first pixel units P1 and a plurality of second pixel units P2. The plurality of first pixel units P1 and the plurality of second pixel units P2 are arranged in an array. Each of the plurality of first pixel units P1 comprises a plurality of subpixels. Each subpixels of the first pixel unit is formed with a microcavity. Each of the plurality of second pixel units P2 comprises a plurality of subpixels. None of the subpixels of the second pixel unit is formed with a microcavity.

The array substrate further comprises a control circuit. The control circuit is configured to switch the plurality of first pixel units P1 and the plurality of second pixel units P2 between a first mode and a second mode. In the first mode, the plurality of first pixel units P1 are the primary light-emitters. In the second mode, the plurality of second pixel units P2 are the primary light-emitters. In at least some embodiments, the control circuit comprises a multiplexer that is configured to adjust the supply of current to the first pixel units P1 or the second pixel units P2, so as to switch the first and second pixel units P1, P2 between the first and second mode. In at least some embodiments, the control circuit may comprise a first input and a second input configured to receive, respectively, first signals for switching the plurality of first pixel units P1 between the first and second modes, and second signals for switching the plurality of second pixel units P2 between the first and second modes.

Each of the plurality of first pixel units P1 comprises a first plurality of subpixels. Each of the plurality of second pixel units P2 comprises a second plurality of subpixels. The subpixels may be configured to emit lights of different colors. Each of the first and second subpixels may be configured as a red subpixel (R) for emitting red light, a green subpixel (G) for emitting green light, or a blue subpixel (B) for emitting blue light. Each subpixel comprises a first electrode (for example, a reflective electrode), a hole injection layer, a hole transport layer, an emission layer, an electron transport layer, an electron injection layer, and a second electrode (for example, a transparent or semi-transparent electrode) arranged in this order in a stack.

A microcavity is formed between the first and second electrodes. More particularly, the hole injection layer, the hole transport layer, the emission layer, the electron transport layer, and the electron injection layer between the first and second electrodes create an optical microcavity. The microcavity length is fixed by the distance between the first and second electrodes, and defines the resonant wavelength. In other words, the microcavity length can be adjusted by adjusting the thickness of one or more of the layers between the first and second electrodes, so that the microcavity resonates at a desired wavelength. Only a certain wavelength corresponding to the fixed cavity length is emitted at a given angle. For example, in a red subpixel, the microcavity will resonate at wavelengths corresponding to red light, and light having those wavelengths will be emitted in a specific angle.

In a green subpixel, the microcavity will resonate at wavelengths corresponding to green light, and light having those wavelengths will be emitted in a specific angle. In a blue subpixel, the microcavity will resonate at wavelengths corresponding to blue light, and light having those wavelengths will be emitted in a specific angle. The presence of microcavities in a pixel unit can therefore narrow or fine-tune the emission spectrum of the pixel unit by significantly enhancing intensity at wavelengths that correspond to the microcavities' resonant frequencies, while reducing intensity at wavelengths outside of those resonance frequencies. A fine-tuned spectrum in turn makes it possible to enhance the color gamut, and improve the color purity and vivacity of the display panel.

In at least some embodiments, one of the first and second electrodes is conductive and transparent or semitransparent, and may be composed of a metal oxide such as, but not limited to, indium-tin oxide (ITO), zinc-tin oxide (ZTO), tin-oxide (SnOx), indium oxide (InOx), molybdenum oxide (MoOx), tellurium oxide (TeOx), antimony oxide (SbOx), and zinc oxide (ZnOx); or a metal such as, but not limited to Ag, Au, Al, and, alloys thereof. In embodiments where the transparent or semitransparent electrode is composed of a metal, the metal is made to be thin so as to be transparent or semitransparent. The other one of the first and second electrodes is conductive and reflective, and may be composed of a reflective metal such as, but not limited to, Ag, Au, Al, and alloys thereof.

The control circuit is configured to switch the first pixel units and the second pixel units between the first mode and the second mode. In the first mode, the plurality of first pixel units are the primary light-emitters. In the second mode, the plurality of second pixel units are the primary light-emitters. More particularly, in the first mode where the plurality of first pixel units are the primary light-emitters, the luminance of the first pixel units is higher than the luminance of the second pixel units. The relative luminance of the first pixel units and the second pixel units may be configured so that each first pixel unit has a higher luminance than each second pixel unit. In other embodiments, the relative luminance of the first pixel units and the second pixel units may be configured so that the average luminance of the plurality of first pixel units is higher than the average luminance of the plurality of second pixel units. In at least some embodiments, in the first mode, the ratio of the luminance of the first pixel units to the luminance of the second pixel units is from 3:2 to 4:1.

In the second mode where the plurality of second pixel units are the primary light-emitters, the luminance of the first pixel units is lower than the luminance of the first pixel units. In at least some embodiments, in the second mode, the ratio of the luminance of the first pixel units to the luminance of the second pixel units is from 1:4 to 2:3. When the relative luminance of the first and second pixel units are within the above ranges, the array substrate can strike a remarkable balance between viewing angles and display colors.

An array substrate according to the present disclosure includes a plurality of first pixel units and a plurality of second pixel units. Each first pixel unit comprises a first plurality, of subpixels. Each of the first plurality of subpixels comprises a microcavity. Each second pixel unit comprises a second plurality of subpixels. None of the second plurality of subpixels comprises a microcavity. When a viewer is viewing the display panel from the front, control is configured to switch the first and second pixel units to a first mode in which the plurality of first pixel units are the primary light emitters. When the viewer is viewing the display panel at an angle, the control circuit is configured to switch the first and second pixel units to a second mode in which the plurality of second pixel units are the primary light emitters. In some embodiments, a camera may be provided on the front of the display panel, and may be configured to detect a position of the viewer. Based on the detected position of the viewer, the first and second pixel units may be controlled to switch between the first and second modes. In some embodiments, the display panel may be configured to permit the viewer to manually switch between the first and second modes. An array substrate according to the present disclosure is configured to switch between the first and second modes depending on the viewer's viewing angle, which makes it possible to strike a remarkable balance between viewing angles and display colors, and to optimize the display effects for the viewer. In addition, an array substrate according to the present disclosure has a simple construction, which can lower the manufacturing costs.

In least some embodiments, the array substrate may comprise an equal number of first pixel units P1 and second pixel units P2, for example, as shown in FIG. 1. The first pixel units P1 and the second pixel units P2 may be arranged in an alternating manner, for example, also as shown in FIG. 1. More particularly, the first pixel units P1 and the second pixel units P2 may be arranged in an alternating manner both in the first direction of the array substrate (for example, corresponding to a width direction of the array substrate, which is the horizontal direction in FIG. 1), and in the second direction of the array substrate (for example, corresponding to a length direction of the array substrate, which is the vertical direction in FIG. 1). Arranging the first and second pixel units P1, P2 in an alternating manner may further enhance the balance between color gamut and viewing angles. In some embodiments, the alternating arrangement of the first and second pixel units P1, P2 may be P1P2P1P2 . . . , for example, as shown in FIG. 1. In other embodiments, the alternating arrangement of the first and second pixel units P1, P2 may be P1P1P2P2 . . . . The alternating arrangement of the first and second pixel units P1, P2 may also be based on the colors of the pixel units, for example, in the order of R1R2G1G2B1B2, where R1 is a red light-emitting first pixel unit, G1 is a green light-emitting first pixel unit, B1 is a blue light-emitting first pixel unit, and so on. The present disclosure refers to embodiments of the array substrate in which the first and second pixel units P1, P2 are arranged in the alternating manner illustrated in FIG. 1, but it is understood that arrangement of the first pixel units and the second pixel units in the array substrate are not limited to those specific embodiments.

In at least some embodiments, the first pixel units P1 and the second pixel units P2 may be provided in the array substrate in different quantities. For example, the ratio of the number of first pixel units P1 to the number of second pixel units P2 may be 1:2, 2:3, or any other suitable ratios known to a person of ordinary skill in the art depending on need.

FIG. 2 shows a schematic diagram of a subpixel in an array substrate according to an embodiment of the present disclosure.

In the array substrate of the present disclosure, each of the plurality of first pixel units P1 comprises a first plurality of subpixels. Each of the plurality of second pixel units P2 comprises a second plurality of subpixels. As shown in FIG. 2, each of the first and second subpixels comprises a hole injection layer 1, a hole transport layer 2, an emission layer 3, an electron transport layer 4, and an electron injection layer 5 arranged in this order in a stack. These layers collectively form the functional stack of an OLED.

In at least some embodiments, each first pixel unit P1 may comprise a first subpixel, a second subpixel, and a third subpixel arranged in this order in the first direction of the array substrate. The first direction of the array substrate corresponds to a width direction of the array substrate, which is the horizontal direction in FIG. 1.

The first subpixel is a red subpixel R. The second subpixel is a green subpixel G. The third subpixel is a blue subpixel B. The first subpixel comprises a first functional stack comprising a first hole injection layer, a first hole transport layer, a first emission layer, a first electron transport layer, and a first electron injection layer arranged in this order. The total thickness of the first functional stack is from 300 nm to 360 nm. The second subpixel comprises a second functional stack comprising a second hole injection layer, a second hole transport layer, a second emission layer, a second electron transport layer, and a second electron injection layer arranged in this order. The total thickness of the second functional stack is from 230 nm to 300 nm. The third subpixel comprises a third functional stack comprising a third hole injection layer, a third hole transport layer, a third emission layer, a third electron transport layer, and a third electron injection layer arranged in this order. The total thickness of the third functional stack is from 180 nm to 240 nm. The first, second, and third subpixels are thus each formed with a microcavity that resonates within a specific range of wavelengths.

In at least some embodiments, each second pixel unit P2 may comprise a fourth subpixel, a fifth subpixel, and a sixth subpixel arranged in this order in the first direction of the array substrate. The first direction of the array substrate corresponds to a width direction of the array substrate, which is the horizontal direction in FIG. 1. The fourth subpixel is a red subpixel R. The fifth subpixel is a green subpixel G. The sixth subpixel is a blue subpixel B. The fourth subpixel comprises a fourth functional stack comprising a fourth hole injection layer, a fourth hole transport layer, a fourth emission layer, a fourth electron transport layer, and a fourth electron injection layer arranged in this order. The total thickness of the fourth functional stack is from 100 nm to 140 nm. The fifth subpixel comprises a fifth functional stack comprising a fifth hole injection layer, a fifth hole transport layer, a fifth emission layer, a fifth electron transport layer, and a fifth electron injection layer arranged in this order. The total thickness of the fifth functional stack is from 90 nm to 130 nm. The sixth subpixel comprises a sixth functional stack comprising a sixth hole injection layer, a sixth hole transport layer, a sixth emission layer, a sixth electron transport layer, and a sixth electron injection layer arranged in this order. The total thickness of the sixth functional stack is from 80 nm to 120 nm. The fourth, fifth, and sixth subpixels are thus each formed without a microcavity.

In other words, the functional stack in a first pixel unit has a different configuration from the functional stack in a second pixel unit. For example, the functional stack in the first pixel unit may have a different thickness from that of the functional stack in the second pixel unit. The thicknesses of the functional stacks in the first and second pixel units may be adjusted by adjusting the thickness of the corresponding hole injection layer, hole transport layer, emission layer, electron transport layer, and/or electron injection layer. In at least some embodiments, the thickness of the functional stack in the first or second pixel unit is adjusted by adjusting the thickness of the hole injection layer. In at least some embodiments, the thickness of the functional stack in the first or second pixel unit is adjusted by adjusting the thickness of the hole transport layer.

Figure 3:
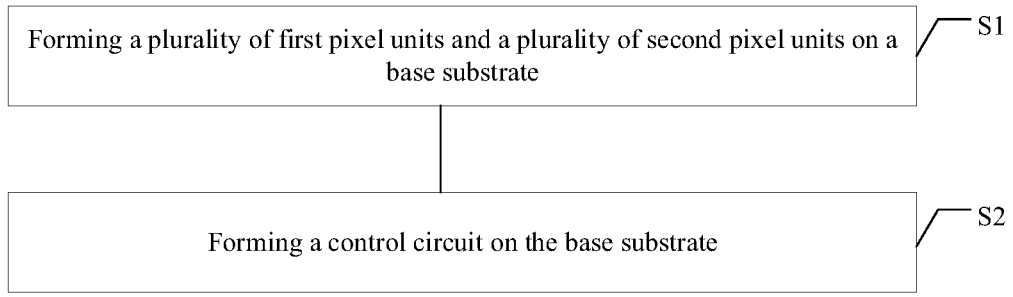
FIG. 3 shows a flow chart of a method of fabricating an array substrate according to an embodiment of the present disclosure.

The present disclosure also provides a method of fabricating an array substrate. FIG. 3 shows a flow chart of a method of fabricating an array substrate according to an embodiment of the present disclosure.

In step S1, the plurality of first pixel units and the plurality of second pixel units are formed on a base substrate. The plurality of first pixel units and the plurality of second pixel units are arranged in an array on the base substrate. Each first pixel unit comprises a first plurality of subpixels. Each of the first plurality of subpixels comprises a microcavity. Each second pixel unit comprises a second plurality of subpixels. None of the second plurality of subpixels is formed with a microcavity.

In step S2, a control circuit is formed on the base substrate. The control circuit is operable to switch the plurality of first pixel units and the plurality of second pixel units between a first mode and a second mode. In the first mode, the plurality of first pixel units are the primary light-emitters. In the second mode, the plurality of second pixel units are the primary light-emitters.

Each subpixel comprises a hole injection layer 1, a hole transport layer 2, an emission layer 3, an electron transport layer 4, and an electron injection layer 5 arranged in this order to form a functional stack, for example, as shown in FIG. 2. The first and second subpixels of the first and second pixel units, respectively, may be adjusted to have functional stacks of different thicknesses. In some embodiments, hole injection layers of different thicknesses are provided for the first and second pixel units, so as to produce first pixel units having a first plurality of subpixels with microcavities, and second pixel units having a second plurality of subpixels without microcavities.

Figure 4:
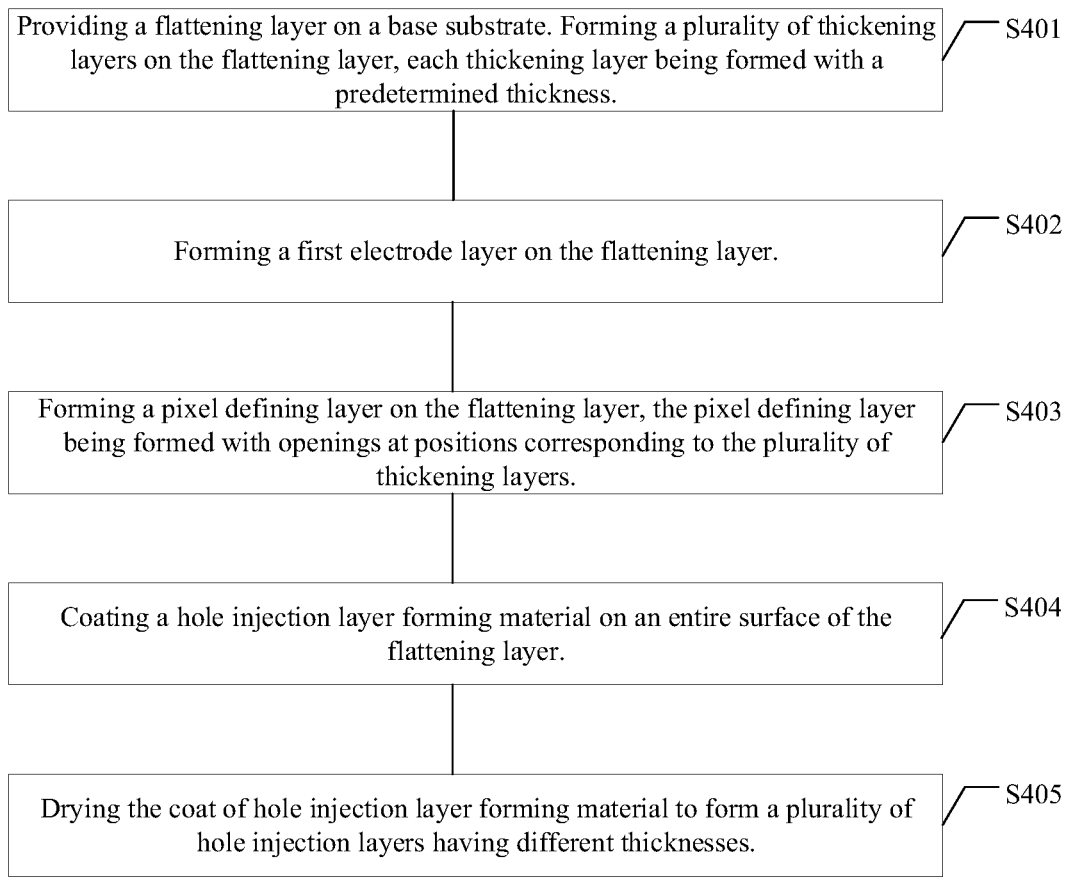
FIG. 4 shows a flow chart of a method of fabricating hole injection layers of varying thicknesses on an array substrate according to an embodiment of the present disclosure.

FIG. 4 shows a flow chart of a method of fabricating hole injection layers of varying thicknesses on an array substrate according to an embodiment of the present disclosure. FIGS. 5 to 10 show schematic diagrams of a method of fabricating hole injection layers of varying thicknesses on an array substrate according to an embodiment of the present disclosure. The thicknesses of the hole injection layers are varied in the embodiments described below, but it is understood that the thickness of one or more layers of the functional stack other than the hole injection layer (for example, hole transport layer, emission layer, electron transport layer, and/or electron injection layer) may also be adjusted.

As shown in FIG. 4, to fabricate the first and second pixel units, a method according to the present disclosure may comprise:

Step S401: A flattening layer is provided on a base substrate. In at least some embodiments, the flattening layer functions as the base substrate. A plurality of thickening layers are formed on the flattening layer. Each thickening layer is formed with a predetermined thickness. In at least some embodiments, each of the plurality of thickening layers has a different thickness. The thickening layers may be formed of silicon dioxide, silicon nitride, or organic photoresist material. The thickening layers may be formed according to any suitable process known to a person of ordinary skill in the art.

Step S402: A first electrode layer is formed on each of the plurality of thickening layers. The first electrode layers are formed with a uniform thickness. The first electrode layers may be formed according to any suitable process known to a person of ordinary skill in the art.

Step S403: A pixel defining layer is formed on the flattening layer. A plurality of openings are formed in the pixel defining layer at positions corresponding to the plurality of thickening layers. The pixel defining layer is formed with a uniform thickness. The pixel defining layer may be formed according to any suitable process known to a person of ordinary skill in the art.

Step S404: A hole injection layer forming material is coated on an entire surface of the flattening layer. The coat of hole injection layer forming material covers the pixel defining layer, and the plurality of thickening layers and first electrode layer. The hole injection layer forming material nay be coated by any suitable means known to a person of ordinary skill in the art.

Step S405: The coat of hole injection layer forming material is dried to form a plurality of hole injection layers having different thicknesses. The hole injection layer forming material may be dried by any suitable means known to a person of ordinary skill in the art. The present disclosure thus makes it possible to form a plurality of first and second pixel units that comprise, respectively, first and second subpixels having different thicknesses. In at least some embodiments, by providing the plurality of thickening layers, the present disclosure makes it possible to form hole injection layers of different thicknesses using a simple coating process. The present disclosure can thus simplify construction, and reduce manufacturing costs. It is understood that to adjust the thicknesses of the first and second subpixels, the present disclosure is not limited to adjusting the thicknesses of the corresponding hole injection layers. Other layers of the functional stacks in the first and second subpixels (for example, the hole transport layers, the emitting layers, the electron transport layers, and/or electron injection layers) may also be adjusted to impart the subpixels with different thicknesses.

In at least some embodiments, each first pixel unit P1 may comprise a first subpixel, second subpixel, and a third subpixel arranged in this order in the first direction of the array substrate. Each second pixel unit P2 may comprise a fourth subpixel, a fifth subpixel, and a sixth subpixel arranged in this order in the first direction of the array substrate. The first direction of the array substrate corresponds to a width direction of the array substrate, which is the horizontal direction in FIG. 1, Each subpixel comprises a functional stack comprising a hole injection layer, a hole transport layer, an emission layer, an electron transport layer, and an electron injection layer arranged in this order. The functional stacks of the first, second, third, fourth, fifth, and sixth subpixels have thicknesses $T_1$, $T_2$, $T_3$, $T_4$, $T_5$, $T_6$ respectively. The thicknesses of the functional stacks of the subpixels satisfy the following relationship: $T_1 > T_2 > T_3 > T_4 > T_5 > T_6$.

In at least some embodiments, the relative thicknesses of the subpixels are achieved by adjusting the relative thicknesses of the hole injection layers in the functional stacks of the subpixels. More particularly, the hole injection layers in the functional stacks of the subpixels have thickness $T_{H1}$, $T_{H2}$, $T_{H3}$, $T_{H4}$, $T_{H5}$, $T_{H6}$, respectively. The thicknesses of the hole injections layers satisfy the following relationship: $T_{H1} > T_{H2} > T_{H3} > T_{H4} > T_{H5} > T_{H6}$.

The description below refers to an embodiment of the array substrate of the present disclosure comprising a first pixel unit and a second pixel unit having the configurations described above. However, it is understood that the array substrate, the first pixel unit, and the second pixel unit are not limited to this specific embodiment. It is readily apparent to a person of ordinary skill in the art that the technical scheme of an array substrate according to the present disclosure is not limited to a specific combination of the technical features, and covers other technical schemes which are formed by combining the technical features or the equivalent features of the technical features without departing from the spirit and scope of the present disclosure.

Figure 5:
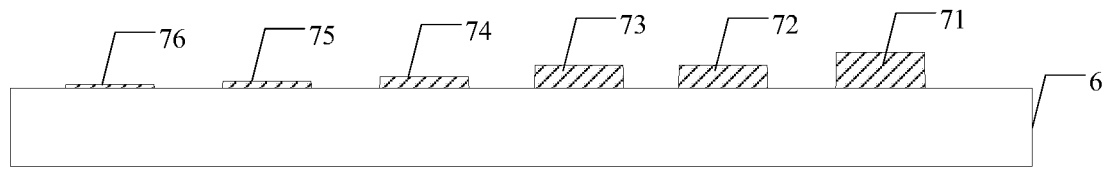
FIGS. 5 to 10 show schematic diagrams of a method of fabricating hole injection layers of varying thicknesses on an array substrate according to an embodiment of the present disclosure.

As shown in FIG. 5, in step S401, a flattening layer 6 is provided. A thickening layer is provided for each subpixel of the first and second pixel units P1, P2. As described above, each first pixel unit P1 may comprise a first subpixel, a second subpixel, and a third subpixel arranged in this order in the first direction of the array substrate. Each second pixel unit P2 may comprise a fourth subpixel, a fifth subpixel, and a sixth subpixel arranged in this order in the first direction of the array substrate. In such an embodiment, a thickening layer is provided for each subpixel, and as a result, a plurality of thickening layers 71, 72, 73, 74, 75, 76 are formed on the flattening layer 6. Each thickening layer has a thickness from 0 to 150 nm. The plurality of thickening layers 71, 72, 73, 74, 75, 76 have thicknesses $T_{71}$, $T_{72}$, $T_{73}$, $T_{74}$, $T_{75}$, $T_{76}$, and the thicknesses satisfy the relationship: $T_{71} > T_{72} > T_{73} > T_{74} > T_{75} > T_{76}$.

In at least some embodiments, the plurality of thickening layers 71, 72, 73, 74, 75, 76 may be formed as follows. Layers of thickening layer forming material are deposited on the flattening layer 6. The thickening layer forming material may comprise silicon dioxide, silicon nitride, or organic photoresist material. The layers of thickening layer forming material may have a thickness of 0 to 150 nm. A photoresist layer is formed on each layer of thickening layer forming material. The photoresist layer is exposed through a predetermined pattern on a half-tone mask and developed, so as to form a plurality of photoresist layers of a predetermined thickness on the layer of thickening layer forming material at positions corresponding to the plurality of thickening layers. The layer of thickening layer forming material and the plurality of photoresist layers are then etched, so as to form the plurality of thickening layers, each having a predetermined thickness. In these embodiments, each thickening layer has a multilayer structure. The layer of thickening layer forming material is formed with varying thicknesses, and the plurality of photoresist layers are formed with the same predetermined thickness. However, it is understood that the plurality of thickening layers may be formed by any suitable process known to a person of ordinary skill in the art. For example, in at least some embodiments, each thickening layer may comprise a single layer, and may be formed with a predetermined thickness on the flattening layer through an inkjet printing process.

Figure 6:
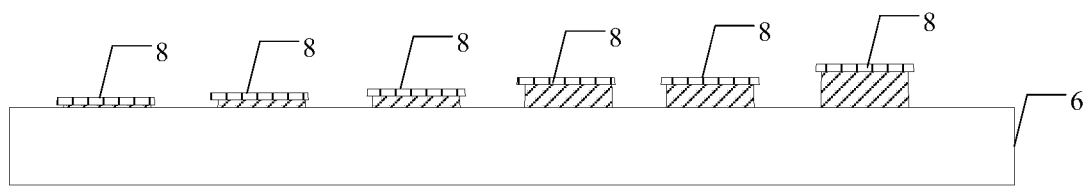

As shown in FIG. 6, in step S402, a first electrode layer 8 is formed on each of the plurality of thickening layers 71, 72, 73, 74, 75, 76. The first electrode layer 8 may be an anode layer. A first electrode material is sputtered on the flattening layer 6 and the plurality of thickening layers 71, 72, 73, 74, 75, 76, and a photoresist layer is formed on the first electrode material. The photoresist layer is exposed and developed to form a pattern in the photoresist layer that corresponds to the plurality of thickening layers 71, 72, 73, 74, 75, 76. The electrode material and the photoresist layer are etched to produce the first electrode layer 8.

Figure 7:
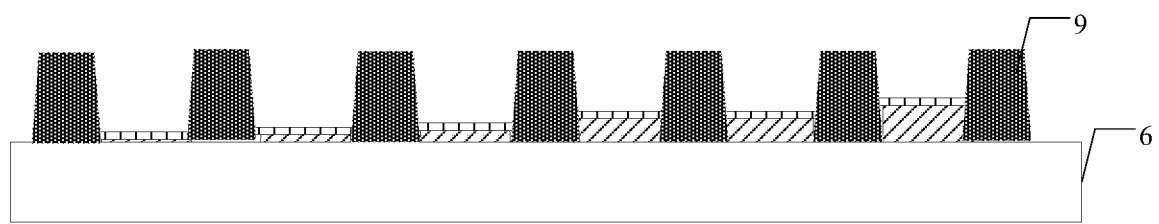

As shown in FIG. 7, in step S403, a pixel defining layer 9 is formed on the flattening layer. The pixel defining layer 9 is formed with a uniform thickness. A pixel defining layer forming material is deposited on the flattening layer 6. The pixel defining layer forming material may be an organic photoresist material. In at least some embodiments, the organic photoresist material is hydrophobic. The pixel defining layer forming material is exposed through a mask and then developed to form openings in the pixel defining layer 9 at positions corresponding to the thickening layers 71, 72, 73, 74, 75, 76, as shown in FIG. 7. The pixel defining layer 9 thus functions to demarcate the subpixels of the first and second pixel units.

Figure 8:
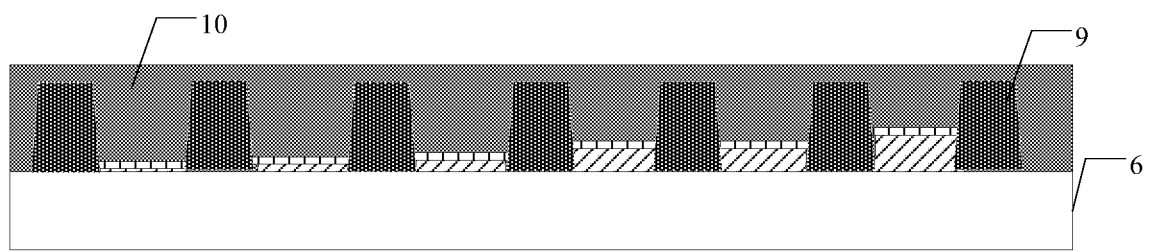
Figure 9:
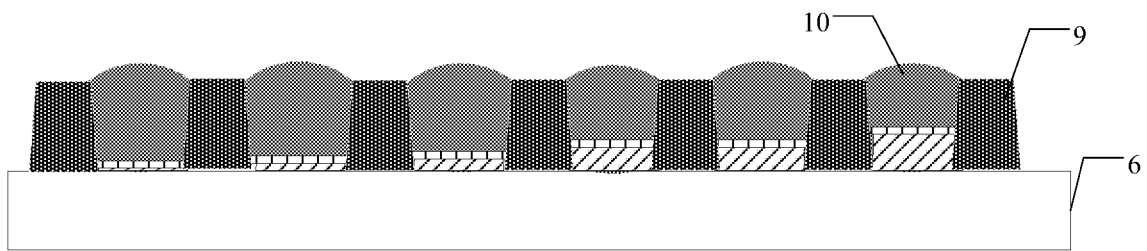

As shown in FIG. 8, in step S404, a hole injection layer forming material 10 is coated on an entire surface of the flattening layer. The coat of hole injection layer forming material 10 covers the pixel defining layer 9, including the openings in the pixel defining layer 9 corresponding to the positions of the plurality of thickening layers 71, 72, 73, 74, 75, 76 and first electrode layers 8. Since the pixel defining layer 9 is composed of a hydrophobic material, the hole injection layer forming material 10 develops a convex meniscus on the first electrode layers 8 in the openings in the pixel defining layer 9, for example, as shown in FIG. 9.

Figure 10:
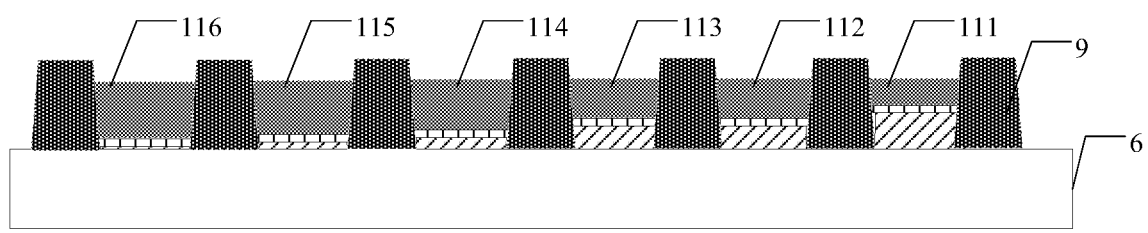

As shown in FIG. 10, in step S405, the hole injection layer forming material 10 is dried to form a plurality of hole injection layers 111, 112, 113, 114, 115, 116 of different predetermined thicknesses. The thicknesses of the hole injection layers are varied in the embodiments described below, but it is understood that the thickness of one or more layers of the functional stack other than the hole injection layer (for example, the hole transport layer) may also be adjusted.

The first hole injection layer 111 is provided on the first thickening layer 71, the second hole injection layer 112 on the second thickening layer 72, the third hole injection layer 113 on the third thickening layer 73, the fourth hole injection layer 114 on the fourth thickening layer 74, the fifth hole injection layer 115 on the fifth thickening layer 75, and the sixth hole injection layer 116 on the sixth thickening layer 76. The volumes of hole injection layers 111, 112, 113, 114, 115, 116 in the openings of the pixel defining layer 9 differ as a result of the different thicknesses of the thickening layers 71, 72, 73, 74, 75, 76. In the embodiment illustrated in FIG. 10, the first hole injection layer 111 has a smaller volume than the second hole injection layer 112 or the third hole injection layer 113. The volumes of the second and third hole injection layer 112, 113 are smaller than that of the fourth hole injection layer 114, which is smaller than that of the fifth hole injection layer 115, which is smaller than that of the sixth hole injection layer 116. As a result, in the embodiment illustrated in FIG. 10, the thicknesses of the hole injection layers $T_{H111}$, $T_{H112}$, $T_{H113}$, $T_{H114}$, $T_{H115}$, $T_{H116}$ satisfy the following relationship: $T_{H116} > T_{H115} > T_{H114} > T_{H113} > T_{H112} > T_{H111}$.

In the array substrate of the present disclosure, the pixel defining layer may have a uniform thickness, and the first electrode layer 8 may have a uniform thickness. The thicknesses of the subpixels may therefore be adjusted by adjusting the thicknesses of the corresponding thickening layers in the subpixels.

After forming the hole injection layers, emission layers, electron transport layers, and electron injection layers are formed on the hole injection layers. The emission layers, electron transport layers, and electron injection layers may be formed according to any appropriate process known to a person of ordinary skill in the art. A second electrode layer is formed on the electron injection layers. The process for forming the second electrode layer is not particularly limited, and the second electrode layer may be formed according to any appropriate process known to a person of ordinary skill in the art. More particularly, the first electrode layer and the second electrode layer are configured so that one of the first and second electrode layers is conductive and transparent or semitransparent, and the other of the first and second electrode layers is reflective. The transparent or semitransparent electrode layer may be composed of a metal oxide such as, but not limited to, indium-tin oxide (ITO), zinc-tin oxide (ZTO), tin-oxide (SnOx), indium oxide (InOx), molybdenum oxide (MoOx), tellurium oxide (TeOx), antimony oxide (SbOx), and zinc oxide (ZnOx); or a metal such as, but not limited to Ag, Au, Al, and alloys thereof. In embodiments where the transparent or semitransparent electrode layer is composed of a metal, the metal is made to be thin so as to be transparent or semitransparent. The reflective electrode layer may be composed of a reflective metal such as, but not limited to, Ag, Au, Al, and alloys thereof.

The present disclosure also provides a display panel. The display panel comprises an array substrate as described above. The display panel according to the present disclosure may be integrated into, for example, a mobile phone, a tablet, a television, a computer, a display, a notebook computer, a digital photo frame, a navigation system, and any other products or components that provide a display function. In addition, it is understood that the display panel according to the present disclosure may include any other suitable, additional components and/or accessories known to a person of ordinary skill in the art without departing from the spirit and scope of the present disclosure.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. An array substrate, comprising:
   a plurality of first pixel units and a plurality of second pixel units arranged in, alternating manner,
   wherein each of the plurality of first pixel units comprises a first plurality of subpixels, each of the first plurality of subpixels comprising a functional stack that has a thickness of from 180 to 360 nm, and
   wherein each of the plurality of second pixel units comprises a second plurality of subpixels, each of the second plurality of subpixels comprising a functional stack that has a thickness of from 80 to 140 nm.

2. The array substrate according to claim 1, further comprising a control circuit coupled to the plurality of first pixel units and the plurality of second pixel units,
   wherein the control circuit is configured to switch the plurality of first pixel units and the of second pixel units between a first mode and a second mode,
   wherein in the first mode, the plurality of first pixel units are configured to have a luminance higher than the plurality of second pixel units, and
   wherein in the second mode, the plurality of the first pixel units are configured to have a luminance lower than the plurality of second pixel units.

3. The array substrate according to claim 2,
   wherein in the first mode, a ratio of an average luminance of the plurality of first pixel units to an average luminance of the plurality of second pixel units is from 3:2 to 4:1, and
   wherein in the second mode, a ratio of an average luminance of the plurality of first pixel units to an average luminance of the plurality of second pixel units is from 1:4 to 2:3.

4. The array substrate according to claim 1,
   wherein each functional stack comprises a first electrode, a hole injection layer, a hole transport layer, an emission layer, an electron transport layer, and an election injection layer arranged in this order.

5. The array substrate according to claim 4, wherein a thickness of each functional stack is adjusted by adjusting a thickness of a hole injection layer in each functional stack.

6. The array substrate according to claim 5,
   wherein at least one of the first plurality of subpixels and at least one of the second plurality of subpixels comprise a thickening layer, and
   wherein the thickness of the hole injection layer is adjusted by adjusting a thickness of the thickening layer.

7. The array substrate according to claim 4,
   wherein the first plurality of subpixels comprise a first subpixel comprising a first functional stack, a second subpixel comprising a second functional stack, and a third subpixel comprising a third functional stack,
   wherein the first functional stack has a thickness $T_1$ of 300 nm to 360 nm,
   wherein the second functional stack has a thickness $T_2$ of 230 nm to 300 nm, and wherein the third functional stack has a thickness $T_3$ of 180 nm to 240 nm.

8. The array substrate according to claim 7,
   wherein the second plurality of subpixels comprise a fourth subpixel having a fourth functional stack, a fifth subpixel having a fifth functional stack, and a sixth subpixel having a sixth functional stack,
   wherein the fourth functional stack has a thickness $T_4$ of 1.00 nm to 140 nm,
   wherein the fifth functional stack has a thickness $T_5$ of 90 nm to 130 nm, and wherein the sixth functional stack has a thickness T6 of 80 nm to 120 nm.

9. The array substrate according to claim 8, wherein the thicknesses T1, T2, T3, T4, T5, T6 satisfy the relationship: T1>T2>T3>T4>T5>T6.

10. The array substrate according to claim 8, wherein hole injection layers in the first, second, third, fourth, fifth, and sixth functional stacks have thicknesses TH1, TH2, TH3, TH4, TH5, TH6, respectively that satisfy the relationship: TH1>TH2>TH3>TH4>TH5>TH6.

11. A display panel comprising the array substrate according to claim 1.

12. A method of fabricating the array substrate according to claim 1, the method comprising:
    forming a plurality of first pixel units and a plurality of second pixel units on a base substrate,
    wherein the forming of the plurality of first pixel units and the plurality of second pixel units comprises:
        forming a plurality of thickening layers on a flattening layer provided on a base substrate,
        forming a first electrode layer on each of the plurality of thickening layers,
        forming a pixel defining layer comprising openings at positions corresponding to the of thickening layers, and
        forming a hole injection layer on each of the first electrode layer,
    wherein the plurality of thickening layers are formed with different thicknesses.

13. The method according to claim 12,
    wherein the first electrode layers are formed with a uniform thickness, and
    wherein the pixel defining layer is formed with a uniform thickness.

14. The method according to claim 12, wherein the hole injection layers are formed with different thicknesses based on the different thicknesses of the plurality of thickening layers.

15. The method according to claim 12, wherein the forming of the hole injection layer comprises coating a hole injection layer forming material on an entire surface of the first electrode layer and the pixel defining layer.

16. The method according to claim 12, wherein the pixel defining layer comprises a hydrophobic material.

17. The method according to claim 12, further comprising forming a control circuit coupled to the plurality of first pixel units and the plurality of second pixel units.

18. A method of driving the array substrate according to claim 1, the method comprising:
    providing a control circuit coupled to the plurality of first pixel units and the plurality of second pixel units,
    supplying, via the control circuit, signals to the plurality of first pixel units and the plurality of second pixel units to switch simultaneously between a first mode and a second mode,
    wherein in the first mode, the plurality of first pixel units are configured to have a higher luminance than the plurality of second pixel units, and
    wherein in the second mode, the plurality of the first pixel units are configured to have a lower luminance than the plurality of second pixel units.

* * * * *